(12) United States Patent
Huang et al.

(10) Patent No.: US 11,683,908 B2
(45) Date of Patent: Jun. 20, 2023

(54) KNOCKDOWN WATER-COOLING UNIT LATCH DEVICE STRUCTURE

(71) Applicant: ASIA VITAL COMPONENTS CO., LTD., New Taipei (TW)

(72) Inventors: Kuan-Lin Huang, New Taipei (TW); Jun-Chun Chiu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 255 days.

(21) Appl. No.: 17/098,453

(22) Filed: Nov. 16, 2020

(65) Prior Publication Data

US 2022/0159869 A1    May 19, 2022

(51) Int. Cl.
*H05K 7/20* (2006.01)
*F28F 13/00* (2006.01)

(52) U.S. Cl.
CPC .......... *H05K 7/20218* (2013.01); *F28F 13/00* (2013.01)

(58) Field of Classification Search
CPC .. F28F 13/00; H05K 7/20218; H05K 7/20272
See application file for complete search history.

(56) References Cited

U.S. PATENT DOCUMENTS

| | | | |
|---|---|---|---|
| 5,089,936 A | 2/1992 | Kojima et al. | |
| 7,420,808 B2* | 9/2008 | Campbell | H05K 7/20772 165/80.4 |
| 9,733,681 B2* | 8/2017 | Eriksen | G06F 1/20 |

FOREIGN PATENT DOCUMENTS

| | | |
|---|---|---|
| CN | 201805669 U | 4/2011 |
| CN | 102067063 B | 3/2013 |
| CN | 109244052 A | 1/2019 |
| CN | 208607598 U | 3/2019 |
| CN | 111029317 A | 4/2020 |
| TW | M608496 U | 3/2021 |

* cited by examiner

*Primary Examiner* — Lionel Nouketcha
(74) *Attorney, Agent, or Firm* — Demian K. Jackson; Jackson IPG PLLC

(57) ABSTRACT

A knockdown water-cooling unit latch device structure includes a latch device assembly having multiple latch members. The latch members are correspondingly assembled with each other around a water-cooling unit. The latch members are connected with each other via at least one connection member. Alternatively, the latch members are directly assembled with each other by means of engagement or lap joint. The latch members of the latch device assembly are assembled with the water-cooling unit so that when the latch device assembly is assembled with the water-cooling unit, the latch members will not interfere with the water-cooling unit.

8 Claims, 9 Drawing Sheets

KNOCKDOWN WATER-COOLING UNIT LATCH DEVICE STRUCTURE

BACKGROUND OF THE INVENTION

1. Field of the Invention

The present invention relates generally to a knockdown water-cooling unit latch device structure, and more particularly to a water-cooling unit latch device structure composed of multiple latch members with equal sizes. The latch members are assembled with each other around a water-cooling unit, whereby the water-cooling unit is framed in the water-cooling unit latch device structure and securely connected with the latch members.

2. Description of the Related Art

Along with the great enhancement of the requirement for big data and cloud computing service, the requirement for heat dissipation of related electronic products has become higher and higher. Especially, with respect to the server of a large-scale operation center, the operation density is increased so that the waste heat generated in the space with the same size is greatly increased. In order to reduce the energy consumed in heat dissipation, the design of the heat sink has been gradually converted from the air-cooling of the conventional fan into liquid-cooling, in which the heat is carried away from the server to dissipate to the environment. This can solve the problem of high-density waste heat.

In the conventional air-cooling electronic product, each chip has one single corresponding heat sink. In case there are multiple chips in the system, multiple air-cooling heat sinks are arranged in the system corresponding to the chips. With respect to a liquid-cooling product, it is necessary to arrange water pipelines in a limited space of the case. In the narrow space, the main factors affecting the arrangement of the pipelines are: the arrangement of the motherboard, the direction of the inlet and outlet of the water-cooling plate, the inner and outer diameters of the pipelines, the minimum bending radius of the pipeline, etc.

In the process of conversion from air-cooling into liquid-cooling, it often takes place that the motherboard of the client end is designed with air-cooling arrangement, which can be hardly changed into liquid-cooling arrangement. As a result, when laying the pipelines of the water-cooling unit, the downstream manufacturer is limited everywhere. This leads to a lot of affections on the change of the design of the water-cooling product.

Please refer to FIGS. 9 and 10, which are a perspective exploded view of a conventional water block and latch device and a perspective assembled view of the conventional water block and latch device. As shown in the drawings, the water block 3 is made of a softer material such as copper or aluminum so that the water block 3 cannot bear the ledger weight locking pressure. Therefore, it is impossible to directly lock the water block 3 on the heat source. It is necessary to first assemble the water block 3 with a latch device substrate 4 and then lock the latch device substrate 4 on the locking structure of the periphery of the heat source (not shown). In order to avoid leakage, the water incoming tube 31 and the water outgoing tube 32 arranged on the water block 3 are generally connected with the water block 3 by means of welding.

Moreover, in order to avoid leakage, the water incoming tube 31 and the water outgoing tube 32 are secured on the upper side of the water block 3 by means of welding. Therefore, when the latch device substrate 4 is fitted around the water block 3, the water incoming tube 31 or the water outgoing tube 32 will interfere with the latch device substrate 4 so that the latch device substrate 4 cannot be connected with the water block 3. In addition, the water incoming tube 31 and the water outgoing tube 32 cannot be rotated to change the direction so as to solve the interference problem with the latch device substrate 4.

Therefore, in the case of interference of the water block 3 with the latch device substrate 4, it is necessary to form at least one recess 41 on the latch device substrate 4 to avoid the interference of the water incoming tube 31 and the water outgoing tube 32 with the latch device substrate 4. However, with respect to the water incoming tube 31 and the water outgoing tube 32 with different directions, it is necessary to additionally manufacture a different mold for making a latch device substrate 4 corresponding to the water block 3 without interference. The manufacturing cost for the different mold is quite high. Moreover, the recess 41 formed on the latch device substrate 4 with different angle will affect the structural strength of the latch device substrate 4.

In conclusion, the conventional water-cooling unit latch device has some shortcomings as follows:
1. The direction of the water incoming tube of the water block is limited by the installation manner of the core water block.
2. Following the trend of chip design, the water block may have insufficient structural strength. In the assembling process, only after the adaptive latch device substrate is mounted, the water pipelines can be mounted.

In consideration of the above shortcomings, in order to make the liquid-cooling module satisfy use requirements of more clients, the water block must be optimized to increase the freeness of the water incoming tube and water outgoing tube of the water block.

It is therefore tried by the applicant to provide a knockdown water-cooling unit latch device structure to eliminate the shortcomings of the conventional knockdown water-cooling unit latch device.

SUMMARY OF THE INVENTION

It is therefore a primary object of the present invention to provide a knockdown water-cooling unit latch device structure, which is composed of multiple latch members. The latch members are assembled with each other around a water-cooling unit, whereby the water-cooling unit is framed in the water-cooling unit latch device structure and securely connected with the latch members.

To achieve the above and other objects, the knockdown water-cooling unit latch device structure of the present invention includes a latch device assembly having multiple latch members. The latch members are correspondingly assembled with each other around a water-cooling unit. The latch members are securely connected and assembled with each other via at least one connection member. Alternatively, the latch members are directly securely connected and assembled with each other by means of engagement or lap joint.

The knockdown water-cooling unit latch device structure of the present invention is composed of multiple latch members, which are correspondingly assembled with each other around the water-cooling unit. The latch members are connected with each other via at least one connection member. Alternatively, the latch members are directly assembled with each other by means of engagement or lap joint. Accordingly, when the latch device assembly is assembled with the water-cooling unit, the latch members will not interfere with the water-cooling unit so that the latch device assembly can be successfully assembled with the water-cooling unit.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
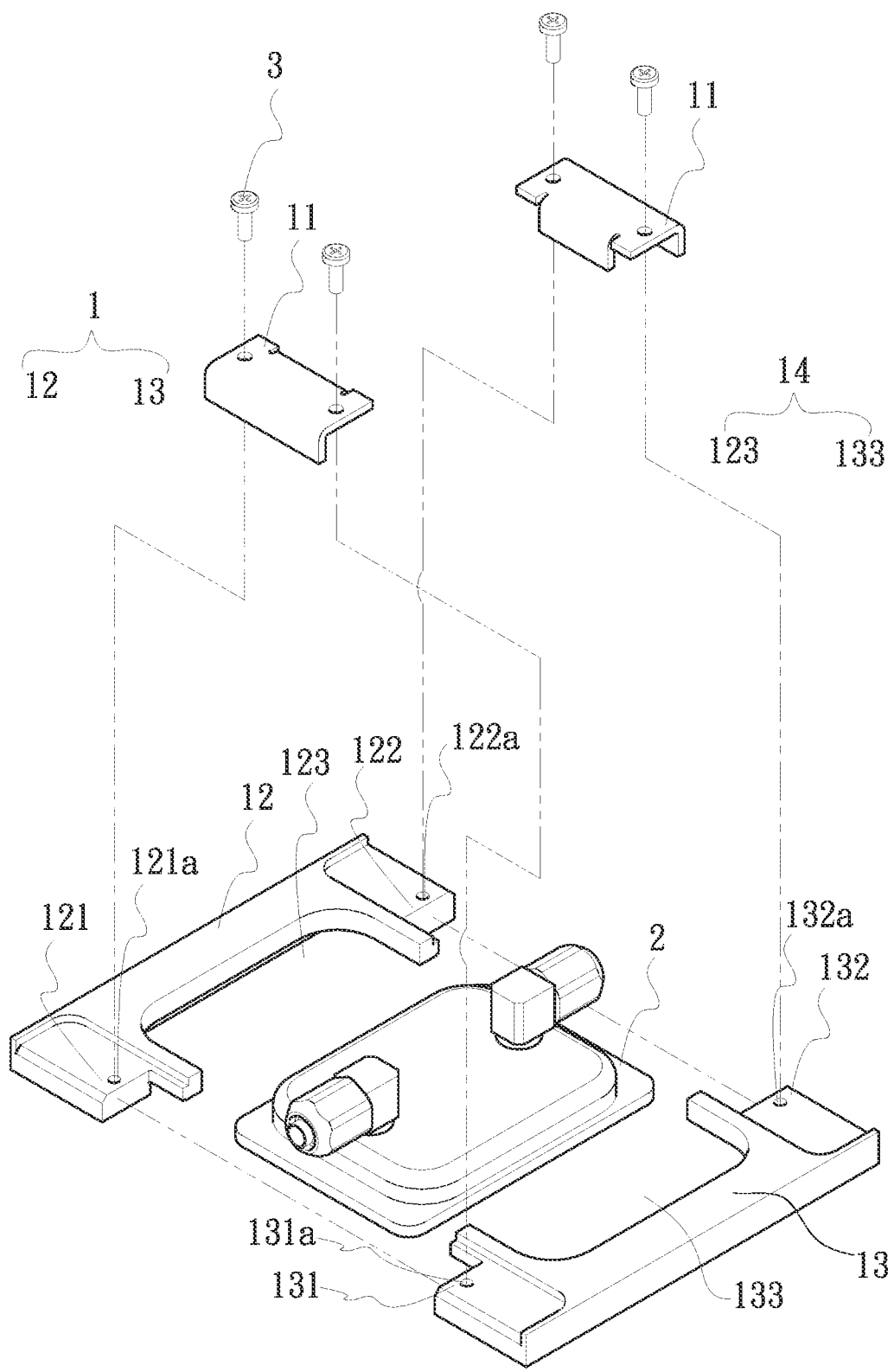
FIG. 1 is a perspective exploded view of a first embodiment of the knockdown water-cooling unit latch device structure of the present invention.
Figure 2:
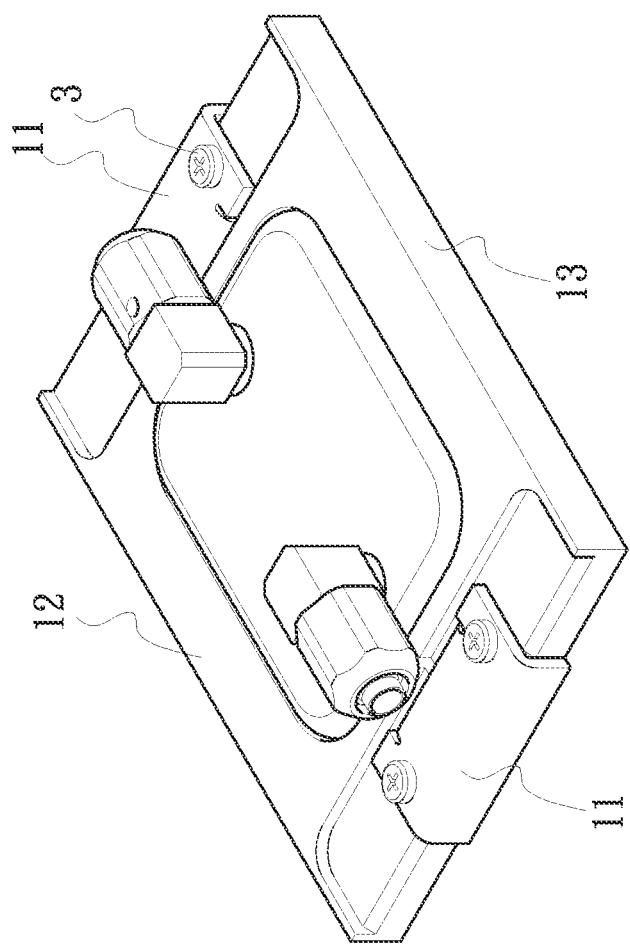
FIG. 2 is a perspective assembled view of the first embodiment of the knockdown water-cooling unit latch device structure of the present invention.

Please refer to FIGS. 1 and 2. FIG. 1 is a perspective exploded view of a first embodiment of the knockdown water-cooling unit latch device structure of the present invention. FIG. 2 is a perspective assembled view of the first embodiment of the knockdown water-cooling unit latch device structure of the present invention. As shown in the drawings, the knockdown water-cooling unit latch device structure of the present invention includes a latch device assembly 1 having multiple latch members. The latch members are correspondingly assembled with each other around a water-cooling unit 2. The latch members are securely connected and assembled with each other via at least one connection member 11. The water-cooling unit 2 is a water block or a water-cooling plate.

In this embodiment, the latch device assembly 1 has a first latch member 12 and a second latch member 13. The first latch member 12 has a first connection end 121 and a second connection end 122, which are respectively positioned at two ends of the first latch member 12. A first recess 123 is formed between the first and second connection ends 121, 122, whereby the first latch member 12 is U-shaped.

The second latch member 13 has a third connection end 131 and a fourth connection end 132, which are respectively positioned at two ends of the second latch member 13. A second recess 133 is formed between the third and fourth connection ends 131, 132, whereby the second latch member 13 is U-shaped.

The first and second latch members 12, 13 are horizontally arranged opposite to each other. The first and third connection ends 121, 131 are correspondingly serially assembled with each other by means of the connection member 11. Also, the second and fourth connection ends 122, 132 are correspondingly serially (connected) assembled with each other by means of the connection member 11. The first and second recesses 123, 133 of the first and second latch members 12, 13 together form a receiving space 14 for receiving the water-cooling unit 2, whereby the water-cooling unit 2 is connected with the latch device assembly 1. The first and second latch members 12, 13 of the latch device assembly 1 are assembled with each other to connect with the water-cooling unit 2 so that when assembled with the water-cooling unit 2, the latch device assembly 1 will not interfere with the water-cooling unit 2.

The connection members 11 are connected with the first and second latch members 12, 13 by means of screwing, insertion, holding, plugging or press fit. In this embodiment, the connection members 11 are connected with the first and second latch members 12, 13 by means of screwing for illustration purposes. The connection members 11 are formed with threaded holes and the first, second, third and fourth connection ends 121, 122, 131, 132 are formed with threaded holes 121a, 122a, 131a, 132a corresponding to the threaded holes of the connection members 11. Screw members 3 are threaded into the threaded holes to securely connect the connection members 11 with the first and second latch members 12, 13 without detachment. Accordingly, the first and second latch members 12, 13 can be securely connected around the water-cooling unit 2 to protect the same. Furthermore, the water-cooling unit 2 can be securely locked and correspondingly assembled on the upper side of a heat source.

Figure 3:
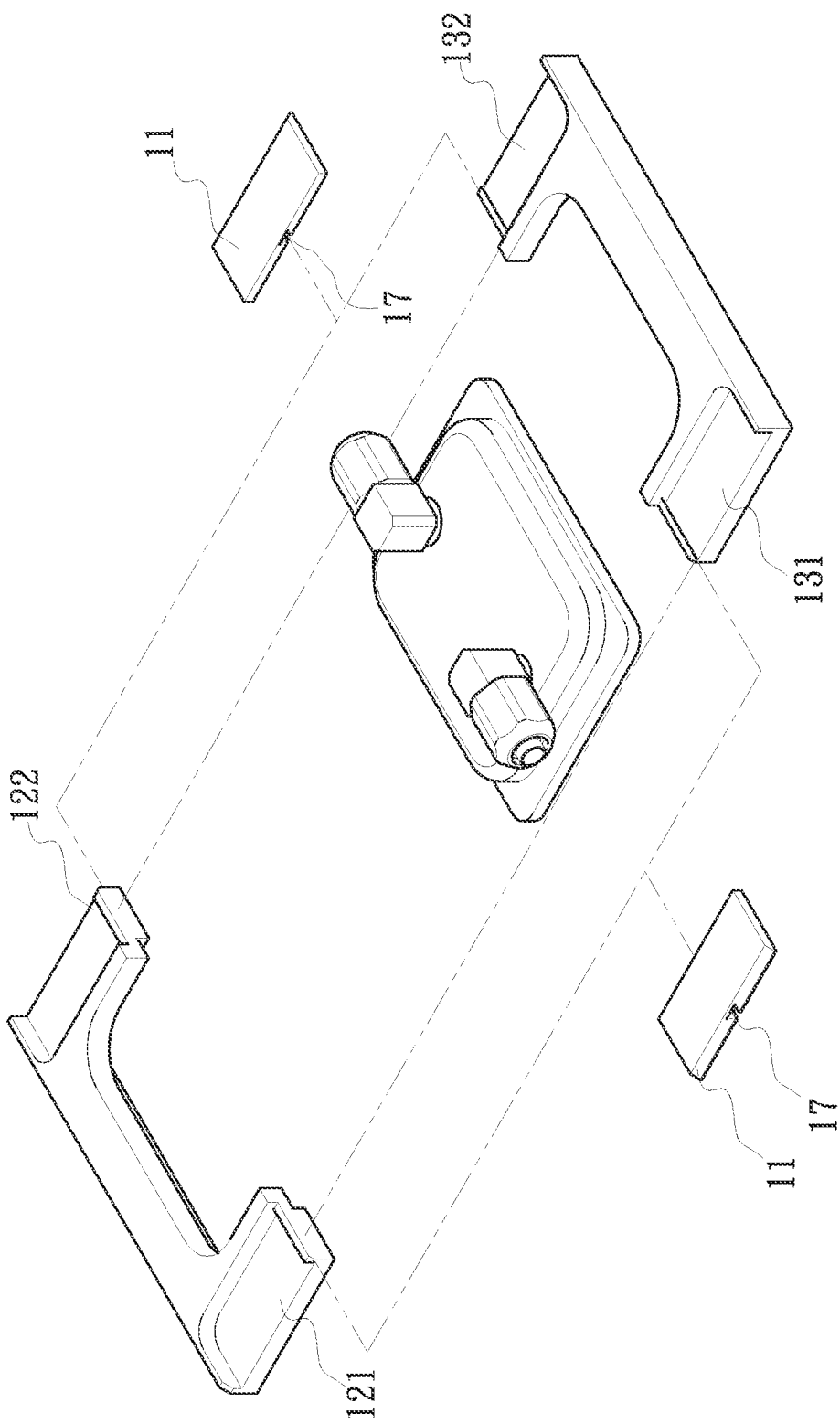
FIG. 3 is a perspective exploded view of a second embodiment of the knockdown water-cooling unit latch device structure of the present invention.
Figure 4:
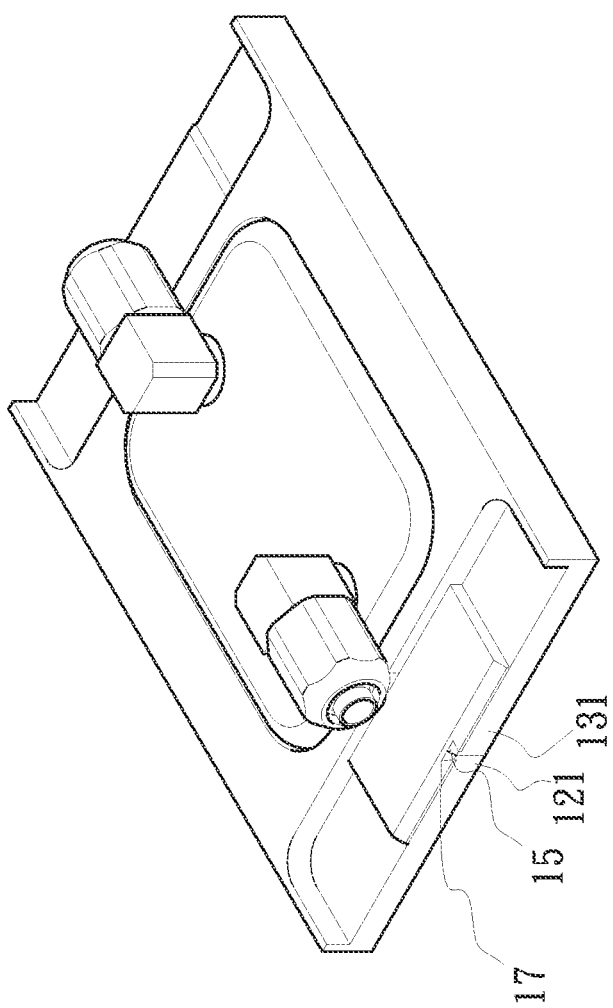
FIG. 4 is a perspective assembled view of the second embodiment of the knockdown water-cooling unit latch device structure of the present invention.

Please now refer to FIGS. 3 and 4. FIG. 3 is a perspective exploded view of a second embodiment of the knockdown water-cooling unit latch device structure of the present invention. FIG. 4 is a perspective assembled view of the second embodiment of the knockdown water-cooling unit latch device structure of the present invention. The second embodiment is partially identical to the first embodiment in structure and thus will not be redundantly described hereinafter. The second embodiment is different from the first embodiment in that the first and third connection ends 121, 131 and the second and fourth connection ends 122, 132 are connected with the connection members 11 by means of recessed/raised engagement structures. The engagement structures are such that the first and third connection ends 121, 131 together form a first dovetailed seat 15, that is, the first connection end 121 has a structural form of a half of the first dovetailed seat 15, while the third connection end 131 has a structural form of another half of the first dovetailed seat 15. The first and third connection ends 121, 131 are connected with each other to together form the first dovetailed seat 15.

The second and fourth connection ends 122, 132 together form a second dovetailed seat 16, that is, the second connection end 122 has a structural form of a half of the second dovetailed seat 16, while the fourth connection end 132 has a structural form of another half of the second dovetailed seat 16. The second and fourth connection ends 122, 132 are connected with each other to together form the second dovetailed seat 16.

The connection member 11 has a dovetailed channel 17. The first and second dovetailed seats 15, 16 are cooperatively inserted into the dovetailed channel 17, whereby the connection member 11 makes the first and second latch members securely connected with each other.

In this embodiment, the recessed/raised engagement structures are provided as an embodiment for connecting the first and second latch members. Alternatively, many other recessed/raised engagement structures can be used for connecting the first and second latch members.

Figure 5:
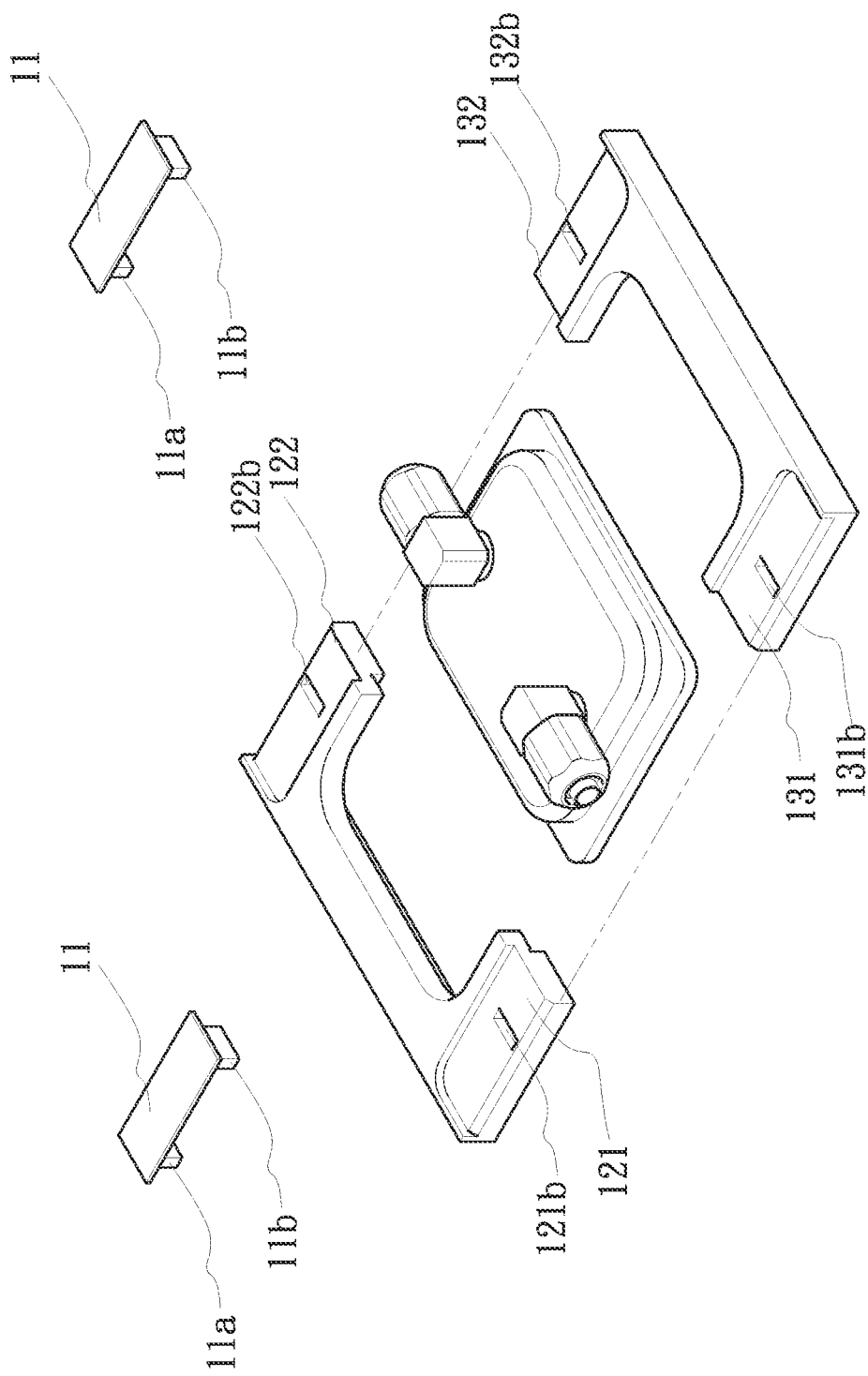
FIG. 5 is a perspective exploded view of a third embodiment of the knockdown water-cooling unit latch device structure of the present invention.
Figure 6:
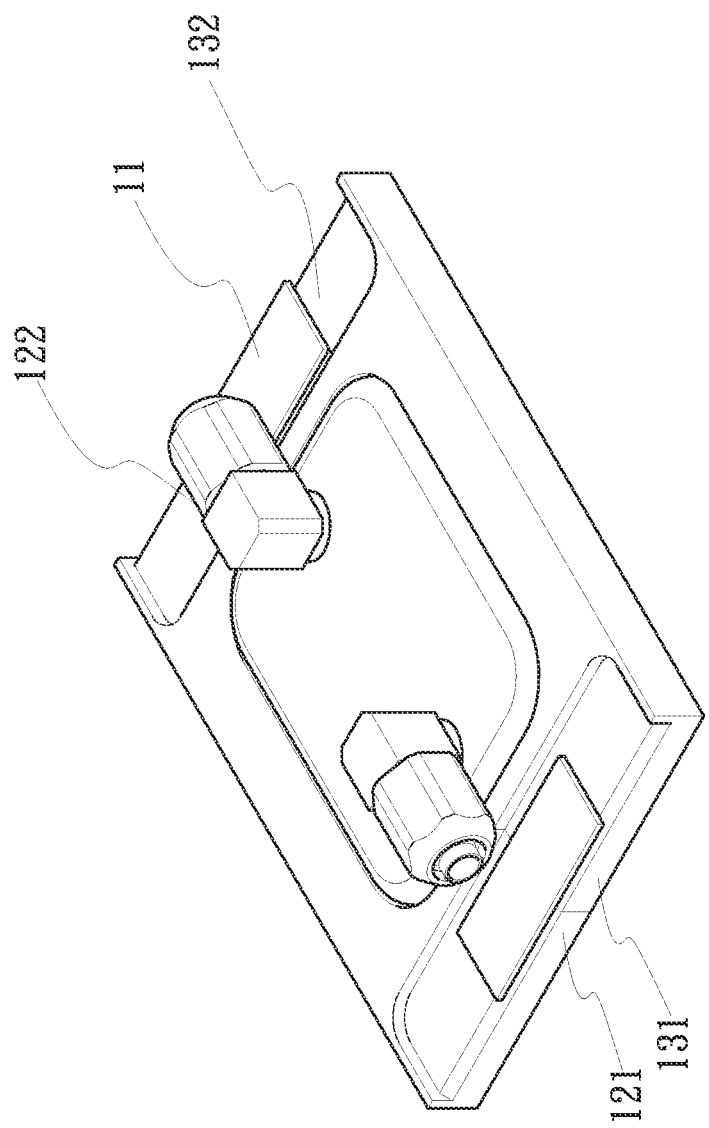
FIG. 6 is a perspective assembled view of the third embodiment of the knockdown water-cooling unit latch device structure of the present invention.

Please now refer to FIGS. 5 and 6. FIG. 5 is a perspective exploded view of a third embodiment of the knockdown water-cooling unit latch device structure of the present invention. FIG. 6 is a perspective assembled view of the third embodiment of the knockdown water-cooling unit latch device structure of the present invention. The third embodiment is partially identical to the first embodiment in structure and thus will not be redundantly described hereinafter. The third embodiment is different from the first embodiment in that the first, second, third and fourth connection ends 121, 122, 131, 132 are respectively formed with a first socket 121b, a second socket 122b, a third socket 131b and a fourth socket 132b. The first and third sockets 121b, 131b are horizontally oppositely arranged and the second and fourth sockets 122b, 132b are horizontally oppositely arranged. The connection member 11 has a first insertion end 11a and a second insertion end 11b. The first and second insertion ends 11a, 11b are correspondingly inserted into the first and third sockets 121b, 131b and the second and fourth sockets 122b, 132b, whereby the connection member 11 makes the first and second latch members securely serially connected with each other.

Figure 7:
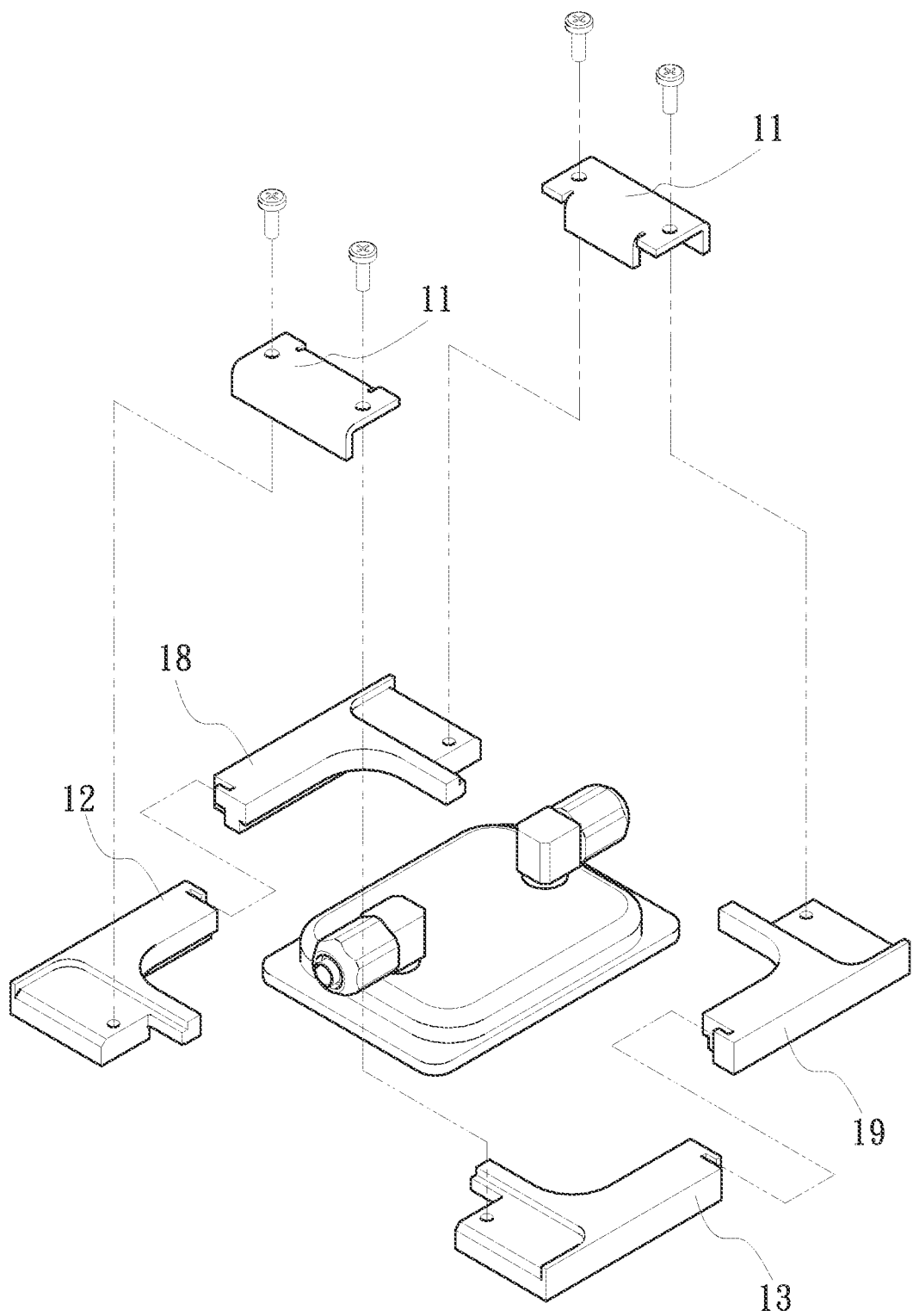
FIG. 7 is a perspective exploded view of a fourth embodiment of the knockdown water-cooling unit latch device structure of the present invention.
Figure 8:
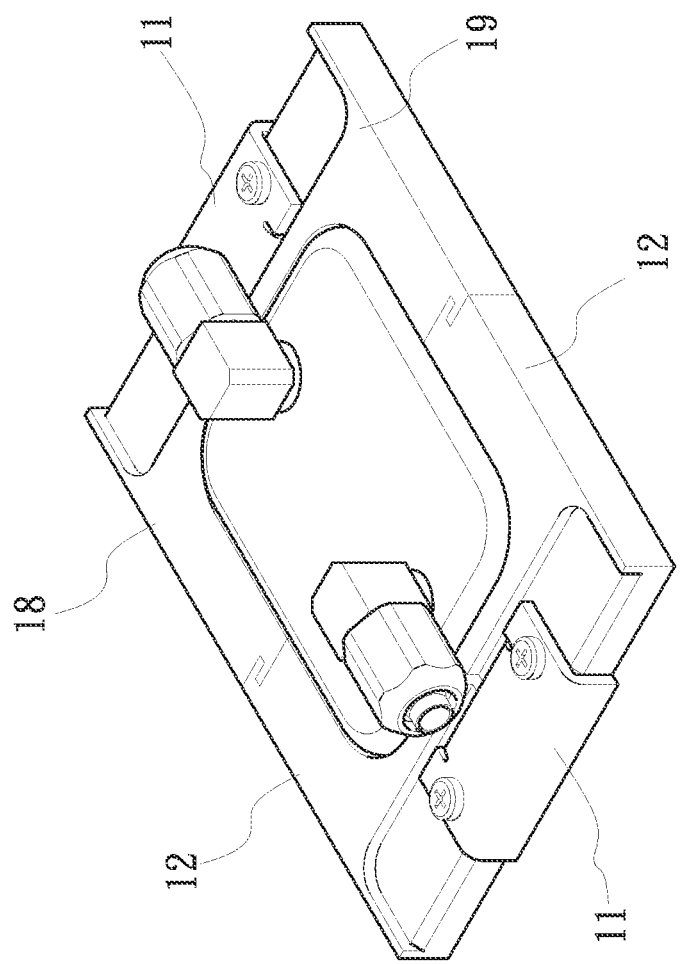
FIG. 8 is a perspective assembled view of the fourth embodiment of the knockdown water-cooling unit latch device structure of the present invention.
Figure 10:
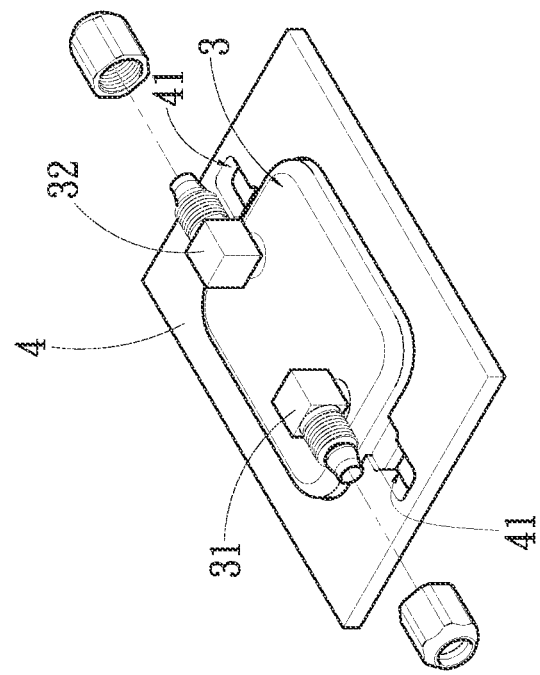
FIG. 10 is a perspective assembled view of the conventional water block and latch device.
Figure 9:
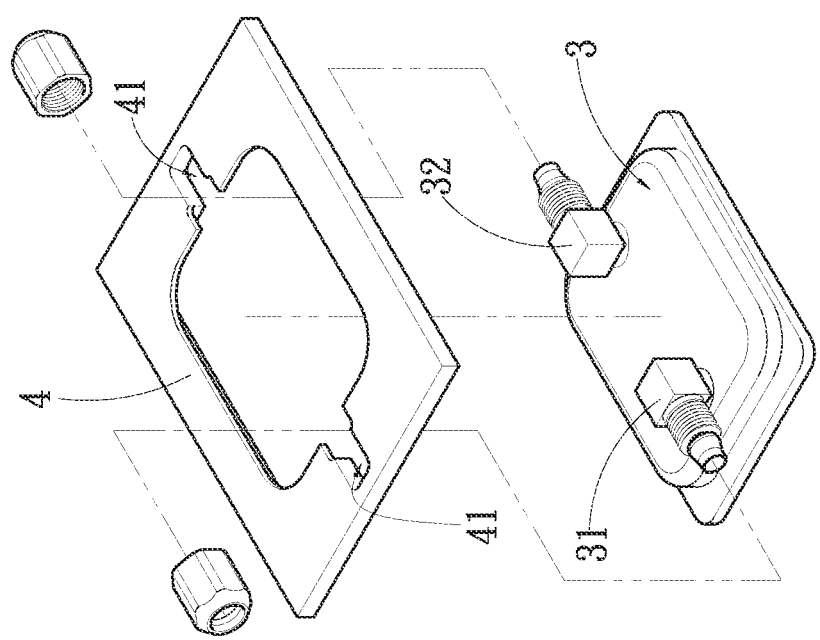
FIG. 9 is a perspective exploded view of a conventional water block and latch device.

Please now refer to FIGS. 7 and 8. FIG. 7 is a perspective exploded view of a fourth embodiment of the knockdown water-cooling unit latch device structure of the present invention. FIG. 8 is a perspective assembled view of the fourth embodiment of the knockdown water-cooling unit latch device structure of the present invention. The fourth embodiment is partially identical to the first embodiment in structure and thus will not be redundantly described hereinafter. The fourth embodiment is different from the first embodiment in that the latch device assembly further has a third latch member 18 and a fourth latch member 19. The first and third latch members 12, 18 are connected with each other by means of insertion. The second and fourth latch members 13, 19 are connected with each other by means of insertion. In this embodiment, the insertion structures are, but not specifically limited to, a recessed structure and a cooperative raised structure. In addition, one end of the first latch member 12 and one end of the second latch member 13 are further connected by means of the connection member 11 and one end of the third latch member 18 and one end of the fourth latch member 19 are further connected by means of the connection member 11. In this embodiment, the connection members 11 are connected with the first, second, third and fourth latch members 12, 13, 18, 19 by means of screwing.

The materials of the first and second latch members 12, 13 and the connection members 11 are selected from a group consisting of copper alloy, aluminum alloy, titanium alloy, stainless steel, pure titanium and plastics. The first and second latch members 12, 13 and the connection members 11 can be made of the same material or different materials.

In the present invention, the latch device assembly 1 is composed of multiple latch members with equal sizes. The latch members are assembled with the water-cooling unit so that when the latch device assembly 1 is assembled with the water-cooling unit, the latch members will not interfere with the water-cooling unit. Furthermore, the cost for the mold can be saved and the interference problem existing in the assembling process can be improved.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A knockdown water-cooling unit latch device structure comprising:
a latch device assembly having multiple latch members, the latch members being correspondingly assembled with each other around a water-cooling unit, the latch members being securely connected and assembled with each other via at least one connection member,
wherein each latch member is provided on an upper surface of the water-cooling unit,
wherein the latch device assembly has a first latch member and a second latch member, the first latch member having a first connection end and a second connection end, which are respectively positioned at two ends of the first latch member, the second latch member having a third connection end and a fourth connection end, which are respectively positioned at two ends of the second latch member, the first and second latch members being horizontally arranged opposite to each other, wherein the at least one connection member is a first connection member and a second connection member, the first and third connection ends being correspondingly serially assembled with each other by means of the first connection member, the second and fourth connection ends being correspondingly serially assembled with each other by means of the second connection member.

2. The knockdown water-cooling unit latch device structure as claimed in claim 1, wherein the connection members are connected with the first and second latch members by means of screwing, insertion or holding.

3. The knockdown water-cooling unit latch device structure as claimed in claim 2, wherein the connection members are formed with threaded holes and the first, second, third and fourth connection ends are formed with threaded holes corresponding to the threaded holes of the connection members, wherein the screw members are threaded into the threaded holes to securely connect the connection members member with the first and second latch members.

4. The knockdown water-cooling unit latch device structure as claimed in claim 2, wherein the first and third connection ends and the second and fourth connection ends are connected with the connection members by means of recessed/raised engagement structures, the engagement structures being such that the first and third connection ends together form a first dovetailed seat and the second and fourth connection ends together form a second dovetailed seat, each of the connection members having a dovetailed channel, the first and second dovetailed seats being inserted into the dovetailed channel, whereby the connection members makes the first and second latch members securely connected with each other.

5. The knockdown water-cooling unit latch device structure as claimed in claim 1, wherein the first latch member has a first recess and the second latch member has a second recess, the first and second recesses being correspondingly assembled together to form a receiving space, the water-cooling unit being framed in the first and second recesses, whereby the water-cooling unit is disposed in the receiving space and connected with the first and second latch members.

6. The knockdown water-cooling unit latch device structure as claimed in claim 1, wherein the water-cooling unit is a water block or a water-cooling plate.

7. The knockdown water-cooling unit latch device structure as claimed in claim 1, wherein the first, second, third and fourth connection ends are respectively formed with a first socket, a second socket, a third socket and a fourth socket, the first and third sockets being horizontally oppositely arranged and the second and fourth sockets being horizontally oppositely arranged, the connection members each having a first insertion end and a second insertion end, the first and second insertion ends being correspondingly inserted in the first and third sockets and the second and fourth sockets.

8. The knockdown water-cooling unit latch device structure as claimed in claim 1, wherein the materials of the first and second latch members and the connection members are selected from a group consisting of copper alloy, aluminum alloy, titanium alloy, stainless steel, pure titanium and plastics, the first and second latch members and the connection members being made of the same material or different materials.

\* \* \* \* \*